US006847063B2

(12) United States Patent
Ohnishi et al.

(10) Patent No.: US 6,847,063 B2
(45) Date of Patent: Jan. 25, 2005

(54) SEMICONDUCTOR DEVICE

(75) Inventors: Teruhito Ohnishi, Osaka (JP); Koichiro Yuki, Kyoto (JP); Shigeki Sawada, Kyoto (JP); Keiichiro Shimizu, Nara (JP); Koichi Hasegawa, Hyogo (JP); Tohru Saitoh, Osaka (JP); Paul A. Clifton, Menlo Park, CA (US)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/413,306

(22) Filed: Apr. 15, 2003

(65) Prior Publication Data

US 2004/0065878 A1 Apr. 8, 2004

(30) Foreign Application Priority Data

Oct. 4, 2002 (JP) ........................................ 2002-292665

(51) Int. Cl.$^7$ ...................... H01L 31/0328; H01L 29/00
(52) U.S. Cl. ........................ 257/197; 257/19; 257/198; 257/564; 257/588; 438/235; 438/309; 438/312; 438/317
(58) Field of Search ............................ 257/19, 197–198, 257/564, 191, 588, 592, 616; 438/235, 309, 312, 317

(56) References Cited

U.S. PATENT DOCUMENTS

| 4,885,614 A | 12/1989 | Furukawa et al. | |
| 6,667,489 B2 * | 12/2003 | Suzumura et al. | ............. 257/12 |
| 2002/0158311 A1 * | 10/2002 | Ohnishi et al. | ............. 257/591 |
| 2002/0163013 A1 * | 11/2002 | Toyoda et al. | ............. 257/197 |

FOREIGN PATENT DOCUMENTS

| EP | 1 065 728 A2 | 1/2001 |
| EP | 1 187 218 A2 | 3/2002 |
| JP | 2001-68479 | 3/2001 |
| JP | P2001-332563 A | 11/2001 |
| JP | P2002-158232 A | 5/2002 |

OTHER PUBLICATIONS

L.D.Lanzerotti et al., "Suppression of Boron Outdiffusion in SiGE HB Ts by Carbon Incorporation", IEDM Technical Digest, pp. 249–252, 1996.

T. Takagi, et al., "Reduction of Neutral Base Recombination in Narrow Band–gap SiGeC Base Heterojunction Bipolar Transistors", Proceedings of the 2000 Bipolar/BiCMOS Circuits and Technology Meetings, pp. 114–117, Sep., 2000.

S. Jayanariayanan, et al., "Potential for Silicon–Germanium–Carbon HBT Operation at Cryogenic Temperatures", Electrochemical Society Proceedings, Electrochemical Society, Pennington, NY, US, vol. 97, No. 2, pp. 240–245, 1997.

A. Biswas et al., "Calculation of Figures of Merit of $Si/Si_{1-x-y}Ge_xC_y/Si$ HBTs and their Optimization", Solid State Electronics, Elsevier Science Publishers, Barking GB, vol. 45, No. 11, pp. 1885–1889, Nov. 2001.

I.M. Anteney et al., "Characterization of the Effectiveness of Carbon Incorporation in SiGe for the Elimination of Parasitic Energy Barriers in SiGe HBT's", IEEE Electron Device Letters, IEEE Inc. New York, US, vol. 20, No. 3, pp. 116–118, Mar. 1999.

(List continued on next page.)

Primary Examiner—Donghee Kang
(74) Attorney, Agent, or Firm—McDermott Will & Emery LLP

(57) ABSTRACT

In a semiconductor device acting as an HBT, an emitter/base laminate portion is provided on a Si epitaxially grown layer in the SiGeC-HBT. The emitter/base laminate portion includes a SiGeC spacer layer, a SiGeC core base layer containing the boron, a Si cap layer, and an emitter layer formed by introducing phosphorous into the Si cap layer. The C content of the SiGeC spacer layer is equal to or lower than that of the SiGeC core base layer.

12 Claims, 7 Drawing Sheets

OTHER PUBLICATIONS

H.J. Osten et al., "Wider Latitude for Sophisticated Devices by Incorporating Carbon into Crystalline Si or SiGe", Microelectronic Engineering, Elsevier Publishers BV., Amsterdam, NL, vol. 56, No. 1–2, pp. 209–212, May 2001.

M.S. Carroll et al., "Quantitative Measurement of Reduction of Boron Diffusion by Substitutional Carbon Incorporation", Materials Research Society Symposium Proceedings, Materials Research Society, Pittsburg, PA, US, vol. 527, Apr. 13, 1998.

D. Knoll et al., "Si/SiGe:C Heterojunction Bipolar Transistors in an Epi–Free Well, Single–Polysilicon Technology", IEEE, 1998.

* cited by examiner

FIG. 3

| Test condi-tion | C content | Ic (A) | Ib (A) | Va (V) | BVcec (V) |
|---|---|---|---|---|---|
| A | Constant at 0.5% | $2.1 \times 10^{-3}$ | $2.6 \times 10^{-5}$ | 22 | 2.6 |
| B | In intrinsic base layer 0.8%<br>In spacer layer 0.2% | $1.4 \times 10^{-3}$ | $4.2 \times 10^{-5}$ | 46 | 3.1 |
| C | In intrinsic base layer 0.5%<br>In spacer layer 0.2% | $2.2 \times 10^{-3}$ | $2.4 \times 10^{-5}$ | 60 | 2.5 |

SEMICONDUCTOR DEVICE

BACKGROUND OF THE INVENTION

The present invention relates to semiconductor devices and more particularly relates to a SiGeC hetero-bipolar transistor (SiGeC-HBT) whose composition is expressed by the chemical formula $Si_{1-x-y}Ge_xC_y$ (hereinafter also referred to simply as "SiGeC").

In recent years, as wireless communication equipment such as mobile telephones and wireless LANs has come to be extensively used in our daily life, high-frequency ICs have come into increasing demand. Conventionally, semiconductor devices capable of operating in high-frequency regions have been difficult to fabricate without using high-cost compound-semiconductor processing technology. Thus, if such semiconductor devices could be fabricated using a silicon process, there would be a great advantage in terms of cost and integration. Bipolar transistors are, among various semiconductor devices, particularly necessary for analog amplification circuits used for wireless communication, and a bipolar transistor capable of operating at high frequency with low power consumption is thus being intensely sought.

In this regard, a hetero-bipolar transistor (SiGeC-HBT) whose core base layer is formed using a technique for epitaxially growing a SiGe:C crystal has recently become practicable as a means for realizing such a low-power-consumption bipolar transistor capable of high-frequency operation. The SiGeC-HBT has improved high-frequency characteristics because the base formed by such a technique can have a very small width, which results in reduction in the base transit time $\tau_F$.

FIG. 7(a) is a cross-sectional view schematically illustrating an exemplary structure of a known SiGeC-HBT, and FIG. 7(b) shows profiles of Ge content, C content and impurity concentration in an emitter/base laminate portion therein.

As shown in FIG. 7(a), the SiGeC-HBT includes a Si substrate 101, a Si epitaxially grown layer 102, deep trench isolations 103, a shallow trench isolation 104, a buried $N^+$ layer 105, and a SIC (self-aligned implanted collector) layer 106. The Si epitaxially grown layer 102 is formed on the Si substrate 101 by epitaxial growth. The deep trench isolations 103, which surround an HBT region, are formed passing through the Si epitaxially grown layer 102 to reach part of the Si substrate 101. The shallow trench isolation 104 is formed in a portion of the Si epitaxially grown layer 102. The buried $N^+$ layer 105, which contains an n-type impurity (such as arsenic (As)) at high concentration, is formed across the boundary between the Si substrate 101 and the Si epitaxially grown layer 102. The SIC layer 106, which is in contact with the buried $N^+$ layer 105, is formed by implanting ions of an n-type impurity (such as phosphorus (P)) into the Si epitaxially grown layer 102. Formed on a collector layer located within the Si epitaxially grown layer 102 over the SIC layer 106 is an emitter/base laminate portion 120 obtained by laminating SiGeC and Si layers.

As shown enlarged in the upper right of FIG. 7(a), the emitter/base laminate portion 120 includes a SiGeC spacer layer 121, a SiGeC core base layer 122, a Si cap layer 123, and an emitter layer 125. The SiGeC spacer layer 121 is epitaxially grown on the Si epitaxially grown layer 102 (the collector layer). The SiGeC core base layer 122, which contains boron at high concentration, is epitaxially grown on the SiGeC spacer layer 121. The Si cap layer 123 is epitaxially grown on the SiGeC core base layer 122. The emitter layer 125 is formed by doping the Si cap layer 123 with an n-type impurity, for example, phosphorus (P).

Further, an external base layer 111 is provided on the emitter/base laminate portion 120 laterally, and an insulating layer 113 and an emitter electrode 112 are provided on the emitter/base laminate portion 120. The insulating layer 113 surrounds an opening for the emitter, and the emitter electrode 112 is surrounded by the insulating layer 113 and in contact with the emitter layer 125 at the opening for the emitter. The emitter electrode 112 is made of polysilicon containing a high concentration of an n-type impurity, for example, phosphorus (P). The emitter layer 125 is formed by heat-treating the phosphorous (P) existing in the emitter electrode 112 to diffuse it into the Si cap layer 123. In addition, the upper portions of a collector wall layer 107 and the emitter electrode 112 are silicide layers 107a and 112a, respectively.

The structure of the SiGeC-HBT shown in FIG. 7(a) is an example of a known SiGeC-HBT. SiGeC-HBTs having a structure other than the structure shown in FIG. 7(a) have been proposed or made practicable. Nonetheless, SiGeC-HBTs typically have an emitter/base laminate portion such as shown in the upper right of FIG. 7(a).

FIG. 7(b) shows a concrete example of the emitter/base laminate portion in the SiGeC-HBT shown in the upper right of FIG. 7(a). The example is described on p. 703 of an IEEE IEDM 98 article entitled "Si/SiGe:C Heterojunction Bipolar Transistors in an Epi-Free Well, Single-Polysilicon Technology" (D. Knoll and ten others, Institute of Semiconductor Physics: IHP).

In FIG. 7(b), the abscissa represents the depth from the upper surface of the Si cap layer 123, and the ordinate represents the Ge content (indicated by the solid line), the C content (indicated by the dashed line), and the B (boron) concentration (indicated by the dotted-dashed line).

As indicated in FIG. 7(b), the Ge content profiles show that the Ge content is substantially constant (about 25%) in the SiGeC spacer layer 121 and is graded in the SiGeC core base layer 122. Specifically, in the SiGeC core base layer 122, the Ge content is the same (about 25%) as in the SiGeC spacer layer 121 at the end portion that contacts the SiGeC spacer layer 121, and is the same (0%) as in the Si cap layer 123 at the end portion that contacts the Si cap layer 123. The C content profiles show that the C content is constant (about 0.1%) at a low level in the SiGeC spacer layer 121 and the SiGeC core base layer 122.

FIG. 8 illustrates an energy band diagram in a SiGeC-HBT having the structure shown in FIG. 7(b). The diagram is illustrated for a longitudinal section passing through the emitter/base junction. While the SiGeC-HBT operates, a voltage positive with respect to the emitter layer 125 is applied to the SiGeC core base layer 122. Thus, the potential of the emitter layer 125 relatively increases, and as shown in FIG. 8, electrons e transit in a conduction band $E_c$ along a path from the emitter layer 125 through the SiGeC core base layer 122 to the SiGeC spacer layer 121 (and then to the collector layer). At this time, the electrons can transit in the SiGeC core base layer 122 at higher speed because the SiGeC core base layer 122 has a gradient composition and thus a gradient potential.

Generally, when a SiGe layer is epitaxially grown on a Si layer, a relatively large strain is caused in the SiGe layer because Ge atoms have a lattice constant greater than Si atoms. The bandgap $E_g$ of the SiGe layer under such strain grows smaller than that of the Si layer. Specifically, the bandgap of the SiGe layer normally decreases by about 7.5 meV for every percent Ge in the composition. To exploit this, in a SiGe-HBT, Ge content in the core base layer is increased in steps heading toward the collector side, thereby grading the Ge profiles. When the Ge profiles are graded such that the Ge content in the core base layer is increased in steps heading toward the collector side, the potential of the conduction band $E_c$ of the core base layer decreases gradually in the direction heading from the emitter side to the collector side. Accordingly, electrons passing through the base can be accelerated so as to reach the collector quickly, resulting in increase in operating speed of the device. Further, the fact that the core base layer contains Ge makes the bandgap $E_g$ smaller. Thus, even if a voltage $V_{be}$ applied to the core base layer is lower, a large amount of a collector current $I_c$ flows. Furthermore, since a band offset in the valence band due to the hetero junction causes the base current $I_b$ to decrease, the current gain $h_{FE}$ increases. As a result, even if the concentration of an impurity (such as boron) is increased in the core base layer, the current gain $h_{FE}$ can be prevented from decreasing. Thus, with the current gain $h_{FE}$ kept at a high level, the base resistance can be reduced. Described above are the basic advantages of a SiGe hetero-bipolar transistor (SiGe-HBT).

On the other hand, advantages of forming a SiGeC core base layer by having the core base layer contain carbon (C) are as follows. In an npn bipolar transistor in which the base layer is doped with boron, there is a problem in that boron diffusion in the SiGe core base layer causes the base resistance to be increased, or the base width to be enlarged, leading to a longer traveling time of the electrons in the base. Because of the boron diffusion due to thermal enhanced diffusion (TED) occurring during heat treatment, it is difficult to make the base width 20 nm or less, for example. Nevertheless, such heat treatment is absolutely necessary for activating impurities introduced by implantation and for driving the emitter impurities from the polysilicon into the cap layer. Further, in order to make the base width small, the impurity concentration has to be high so that punch-though is prevented and the base resistance is reduced. Specifically, making the base width 20 nm or less, for example, requires the boron concentration to be $1 \times 10^{19}$ atoms/cm$^3$ or higher.

The boron diffusion can be controlled by having the SiGe layer contain carbon (C). Thus, the formation of a SiGeC core base layer allows a high concentration of boron to be confined in the small-width base even after heat treatment has been carried out. It has been found that carbon acts effectively when contained at a content of about 0.1% or more. In other words, boron diffusion can be controlled in a SiGeC core base layer, as a result of which the B concentration in the SiGeC core base layer can be kept at a high level.

With the example in the journal article mentioned above, since the SiGeC core base layer 122 contains carbon (C) at about $10^{20}$ atoms/cm$^3$ (about 0.1%), it is possible to reduce the width of the base such that the base transit time $\tau_F$ can be shortened, thus allowing high-speed operation. For example, high-speed operation enabling a cutoff frequency $fT_{max}$ of 65 GHz and a maximum oscillation frequency $f_{max}$ of about 90 GHz has been realized.

However, the known SiGeC-HBT having the emitter/base laminate portion disclosed in the foregoing journal article also has the following drawbacks.

Generally, in a vast majority of circuits, such as differential amplifiers used in wireless communication equipment, variations in the current gain $h_{FE}$ (β) have to be small among the HBTs included in such a circuit. However, in the above-mentioned known SiGeC-HBT, it is difficult to sufficiently reduce variations in the current gain $h_{FE}$. The current gain $h_{FE}$ is the ratio between the collector current $I_c$ and the base current $I_b$. After the emitter/base laminate portion has been formed by an UHV-CVD or like epitaxial growth process, the surface of the laminate portion is cleaned before a polysilicon film, which acts as the emitter electrode, is deposited on the emitter/base laminate portion. After this cleaning process, or while the polysilicon is grown in a CVD chamber at high temperature, a poor $SiO_2$ layer (native oxide film) forms on the surface of the epitaxially grown layer (that is, the emitter/base laminate portion). The non-uniformity of the thickness of the native oxide film formed at the interface between the Si cap layer of the emitter/base laminate portion and the emitter electrode results in variations in the diffusion forming the emitter, hole barriers formed by the native oxide film itself, and other non-uniformity. And the existence of such non-uniformity causes large variations in the base current $I_b$, which turns out to be a principal cause of variations in the current gain $h_{FE}$.

In addition, the base current $I_b$ is reduced due to the hole barriers, which results in an increase in the current gain $h_{FE}$. It is known that such an increase in the current gain $h_{FE}$ leads to a decrease in breakdown voltage $BV_{CEO}$ between the emitter and the collector. The breakdown voltage $BV_{CEO}$ between the emitter and the collector may thus decrease in the known HBT.

Moreover, it is conceivable that in regions with high C content in the SiGeC core base layer, trap sites are created in a general sense by the existence of carbon and as the number of such trap sites increases, the Early voltage decreases.

SUMMARY OF THE INVENTION

It is therefore an object of the present invention to suppress variations in the current gain resulting from non-uniformity in native-oxide-film thickness, while suppressing decrease in the Early voltage, in a semiconductor device functioning as a SiGeC-HBT including an emitter/base laminate portion.

An inventive semiconductor device includes: a Si layer functioning as a collector layer and a semiconductor layer formed over the Si layer and functioning as an emitter layer and as a base layer, wherein the semiconductor layer includes: a core base layer whose composition is expressed by $Si_{1-x1-y1}Ge_{x1}C_{y1}$ (wherein $0<x1<1$, $0.003 \leq y1<1$), and a spacer layer which is formed under and in contact with the core base layer and whose composition is expressed by $Si_{1-x2-y2}Ge_{x2}C_{y2}$ (wherein $0<x2<1$, $0 \leq y2 \leq y1$).

With the inventive semiconductor device, it is possible to reduce variations in the base current owing to such increase in the base current as is not affected by a native oxide film, and at the same time, decrease in the Early voltage can be suppressed. Since variability of $h_{FE}$ is primarily the result of variability of base current, reduced variability of the base current accordingly leads to improved uniformity of $h_{FE}$. At the same time, increased magnitude of base current leads to reduced $h_{FE}$ and consequentially to increased $BV_{CEO}$.

The C proportion y1 in the core base layer composition is preferably 0.015 or less.

When the inventive semiconductor device further includes an emitter electrode formed over the semiconductor layer and made of polysilicon, variations in the current gain can be decreased even if the thickness of the native oxide film formed at the interface between the semiconductor layer and the emitter electrode of polysilicon is non-uniform.

The semiconductor layer preferably further includes a Si cap layer, and an emitter layer is preferably formed in the Si cap layer.

When the C proportion y2 in the spacer layer composition is 0.007 or less, the Early voltage of the semiconductor device can be maintained over 10.

BRIEF DESCRIPTION OF THE DRAWINGS

FIG. 3 is a table showing the collector current, base current and Early voltage in sample SiGeC-HBTs.

DESCRIPTION OF THE PREFERRED EMBODIMENTS

First Embodiment

Structure of SiGeC-HBT

Figure 1A:
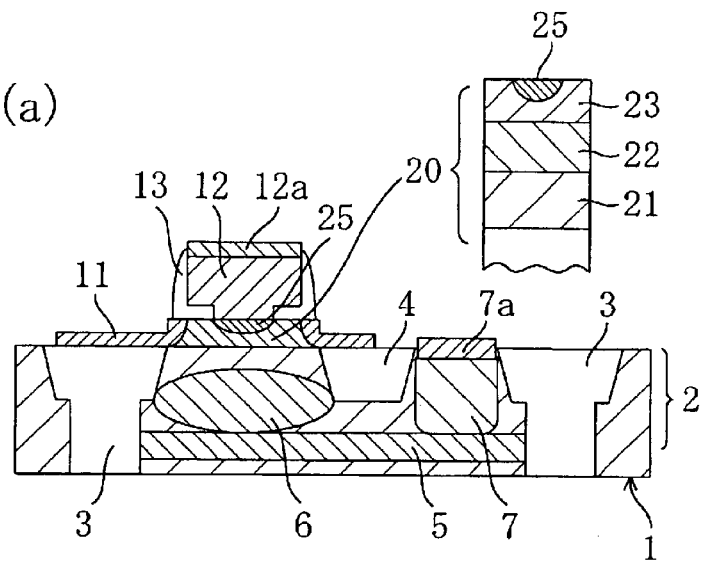
FIG. 1(a) is a cross-sectional view schematically illustrating an exemplary structure of a SiGeC-HBT according to a first embodiment of the present invention.
Figure 1B:
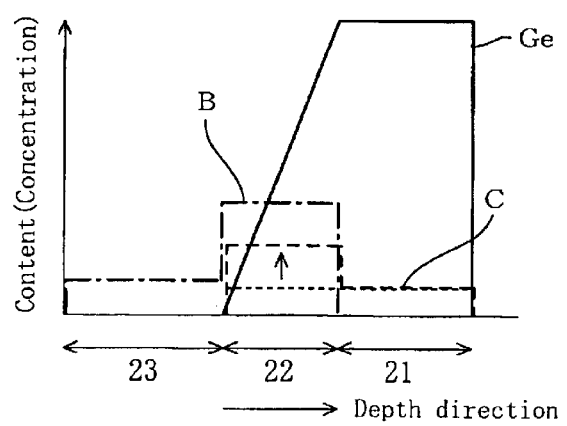
FIG. 1(b) shows profiles of Ge content, C content and impurity concentration in an emitter/base laminate portion therein.

FIG. 1(a) is a cross-sectional view schematically illustrating an exemplary structure of a SiGeC-HBT according to a first embodiment of the present invention, and FIG. 1(b) shows profiles of Ge content, C content and impurity concentration in an emitter/base laminate portion.

As shown in FIG. 1(a), the SiGeC-HBT in this embodiment includes a Si substrate 1, a Si epitaxially grown layer 2, deep trench isolations 3, a shallow trench isolation 4, a buried N$^+$ layer 5, a SIC (self-aligned implanted collector) layer 6, and a collector wall 7. The Si epitaxially grown layer 2 is formed on the Si substrate 1 by epitaxial growth. The deep trench isolations 3 are formed across the boundary between the Si epitaxially grown layer 2 and the Si substrate 1. The shallow trench isolation 4 is formed in the Si epitaxially grown layer 2. The buried N$^+$ layer 5, which contains an n-type impurity (such as arsenic (As)) at high concentration, is formed across the boundary between the Si substrate 1 and the Si epitaxially grown layer 2. The SIC layer 6, which is in contact with the buried N$^+$ layer 5, is formed by implanting ions of an n-type impurity (such as phosphorus (P)) into the Si epitaxially grown layer 2. Formed on a collector layer located within the Si epitaxially grown layer 2 over the SIC layer 6 is an emitter/base laminate portion 20 obtained by laminating SiGeC and Si layers. This schematic structure of the SiGeC-HBT has been conventionally known.

Hereafter, characteristics of the SiGeC-HBT according to this embodiment will be described. As shown enlarged in the upper right of FIG. 1(a), the emitter/base laminate portion 20 includes a SiGeC spacer layer 21, a SiGeC core base layer 22, a Si cap layer 23, and an emitter layer 25. The SiGeC spacer layer 21 is epitaxially grown on the Si epitaxially grown layer 2 (the collector layer). The SiGeC core base layer 22, which contains boron at high concentration, is epitaxially grown on the SiGeC spacer layer 21. The Si cap layer 23 is epitaxially grown on the SiGeC core base layer 22. The emitter layer 25 is formed by introducing an n-type impurity, for example, phosphorus (P) into the Si cap layer 23.

FIG. 1(b) shows a concrete example of the emitter/base laminate portion 20 in the SiGeC-HBT shown in the upper right of FIG. 1(a). In FIG. 1(b), the abscissa represents the depth from the upper surface of the Si cap layer 23, and the ordinate represents the Ge content (indicated by the solid line), the C content (indicated by the dashed line), and the B (boron) concentration (indicated by the dotted-dashed line), wherein the units (atoms/cm$^3$) used to express the boron concentration are different from the units (%) in which the Ge and C contents are expressed.

As indicated in FIG. 1(b), the Ge content profiles show that the Ge content is substantially constant (about 25%) in the SiGeC spacer layer 21 and is graded in the SiGeC core base layer 22. Specifically, in the SiGeC core base layer 22, the Ge content is the same (about 25% in this embodiment) as in the SiGeC spacer layer 21 at the end portion that contacts the SiGeC spacer layer 21, and is 0% at the end portion that contacts the Si cap layer 23. The C content profiles show that the C content is constant (0.2%) at a low level in the SiGeC spacer layer 21, while being constant (about 0.8%) at a higher level in the SiGeC core base layer 22 as compared to the SiGeC core base layer in the known SiGeC-HBT.

As described above, the characteristics of the present invention are that in the emitter/base laminate portion 20, the C content in the SiGeC core base layer 22 is high and the C content in the SiGeC spacer layer 21 is set lower than that in the SiGeC core base layer 22.

In other words, given that the composition of the SiGeC core base layer 22 is expressed by $Si_{1-x1-y1}Ge_{x1}C_{y1}$ and the composition of the SiGeC spacer layer 21 is expressed by $Si_{1-x2-y2}Ge_{x2}C_{y2}$, the following conditions hold.

$0<x1<1, 0.003<y1<1$ $0<x2<1, 0\leq y2 \leq y1$

The basis for this will be described later.

Further, as in the known SiGeC-HBT, an external base layer 11 is provided on the emitter/base laminate portion 20 laterally, and an insulating layer 13 and an emitter electrode 12 are provided on the emitter/base laminate portion 20. The insulating layer 13 surrounds an opening for the emitter, and the emitter electrode 12 is surrounded by the insulating layer 13 and in contact with the emitter layer 25 at the opening for the emitter. The emitter electrode 12 is made of polysilicon containing a high concentration of an n-type impurity, for example, phosphorus (P). The emitter layer 25 is formed by heat-treating the phosphorous (P) existing in the emitter electrode 12 to diffuse it into the Si cap layer 23. In addition, the upper portions of the collector wall layer 7 and the emitter electrode 12 are silicide layers 7a and 12a, respectively.

Process Steps for Fabricating SiGeC-HBT

Figure 2A:
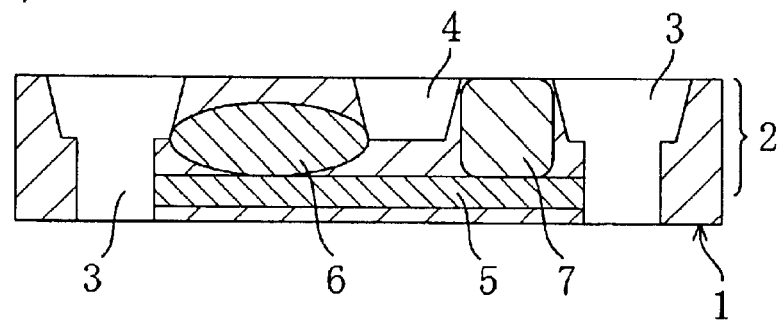
FIGS. 2(a) through 2(c) are cross-sectional views illustrating process steps for fabricating the SiGeC-HBT in the first embodiment.
Figure 2B:
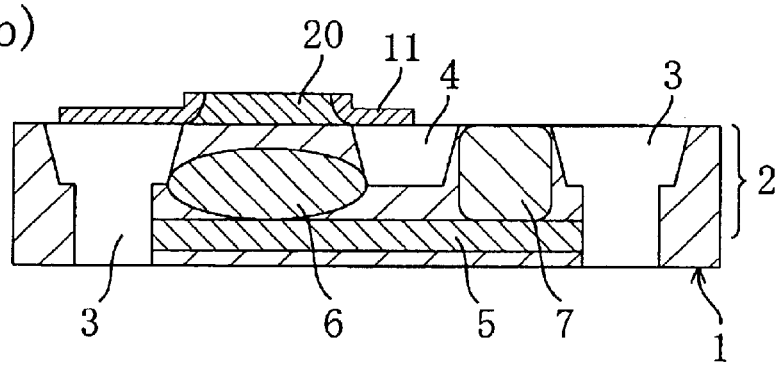
Figure 2C:
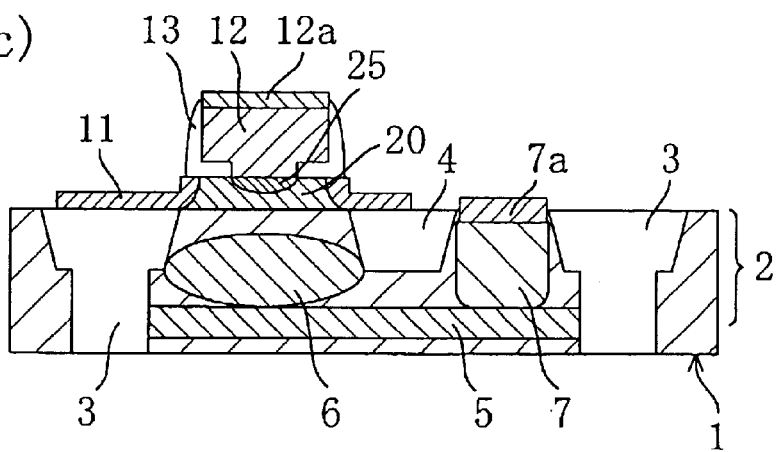

FIGS. 2(a) through 2(c) are cross-sectional views illustrating process steps for fabricating the SiGeC-HBT in this embodiment.

In the process step shown in FIG. 2(a), ions of an n-type impurity (such as arsenic (As)) are implanted into part of the Si substrate 1 at a high concentration, thereby forming the buried N+ layer 5. A Si crystal is then epitaxially grown on the Si substrate to form the Si epitaxially grown layer 2. Thereafter, shallow trenches are formed in the Si epitaxially grown layer 2, and some of the shallow trenches are then formed into deep trenches, which go through the Si epitaxially grown layer 2 to extend into the Si substrate 1. Following this, the lateral faces of the deep trenches are oxidized and the deep trenches are filled with polysilicon, thereby forming the deep trench isolations 3. An oxide film is filled in the shallow trenches that are not formed into the deep trenches, thereby forming the shallow trench isolations 4. Thereafter, in order to increase the device performance by obtaining a retro-grade collector profile by lowering the collector resistance, the SIC layer 6 is formed in the Si epitaxially grown layer 2 by implanting ions of phosphorous (P).

Subsequently, in the process step shown in FIG. 2(b), the SiGeC spacer layer 21 of a thickness of 25 nm, the SiGeC core base layer 22 of a thickness of 20 nm, and the Si cap layer 23 of a thickness of 30 nm are formed on the Si epitaxially grown layer 2 by UHV-CVD. The SiGeC spacer layer 21 is made of 25% content Ge, 0.2% content C, and Si occupying the remainder. The SiGeC core base layer 22, which is doped with boron (B) at a concentration of $1.4 \times 10^{19}$ atoms/cm$^3$, is composed of Ge whose proportion is graded from 25% adjacent to the spacer to 0% adjacent to the cap, of C whose proportion is 0.8% and of Si whose proportion is the remainder. In other words, the emitter/base laminate portion 20 shown in the upper right of FIG. 1(a) is formed. Further, when the SiGeC layers are epitaxially grown, the external base layer 11 is simultaneously formed on the emitter/base laminate portion 20 laterally.

Note that carbon acts effectively to a certain degree when contained in the SiGeC core base layer 22 at a concentration of 0.3% or higher instead of 0.8%.

Then, in the process step shown in FIG. 2(c), a polysilicon film containing phosphorus (P) at a concentration of about $3 \times 10^{20}$ atoms/cm$^3$ is deposited over the substrate. RTA treatment is then carried out at 910° C. so as to diffuse the phosphorous into the cap, thereby forming the emitter electrode 12 and emitter layer 25. While the Co slicide layers 7a and 12a are formed, for example, for attaining reduced resistance, wire is formed. A native oxide film formed during the deposition of the polysilicon film is present between the emitter electrode 12 and the Si cap layer 23 that is the uppermost portion of the emitter/base laminate portion 20. The thickness of the native oxide film is ununiform, which causes variations in the base current, that is, variations in the current gain.

In the known SiGeC core base layer 122 and the SiGeC spacer layer 121, about 0.1% carbon (C) is contained. In this embodiment, on the other hand, about 0.8% carbon (C) is contained in the SiGeC core base layer 22 and about 0.2% carbon (C) is contained in the SiGeC spacer layer 21.

It should be noted that the Si cap layer is doped with boron (B) at about $1 \times 10^{18}$ atoms/cm$^3$ because this works to suppress recombination current in the vicinity of the emitter/base junction, thereby increasing the linearity of the SiGeC-HBT.

Further, in the emitter/base laminate portion 20 in this embodiment, the SiGeC spacer layer 21 is provided below the SiGeC core base layer 22 doped with a high concentration of boron, that is, on the base/collector junction side. The SiGeC spacer layer 21 is provided to prevent the boron introduced into the SiGeC core base layer 22 from diffusing through the SiGeC/Si interface into the collector layer within the Si epitaxially grown layer 2 and causing formation of a parasitic barrier that would otherwise lead to decrease in the device performance.

"Parasitic barrier" means a potential barrier that is created at a SiGeC-Si interface on the Si side because a Si layer (the collector layer in the Si epitaxially grown layer 2 in this embodiment) contacting a SiGeC or SiGe layer (the core base layer in this embodiment) becomes p-type due to the diffused boron, and the bandgap of Si is larger than that of SiGe. The existence of the potential barrier, which interferes with transition of electrons, reduces the device performance greatly.

Nonetheless, it has been found that if the C content of the SiGeC spacer layer is too high, the Early voltage decreases such that the operating characteristics of the SiGeC-HBT deteriorate. In view of this, in this embodiment, the C content of the SiGeC spacer layer 21 is set lower than that of the SiGeC core base layer.

Functions and Effects of Present Invention

In the SiGeC-HBT in this embodiment, the Ge profiles are graded in the SiGeC core base layer 22 such that the Ge content is increased in the direction of the collector side. Thus, the potential of the conduction band $E_c$ of the SiGeC core base layer 22 decreases gradually in the direction heading from the emitter side to the collector side. Accordingly, electrons passing through the base can be accelerated so as to reach the collector more quickly, allowing increase in operating speed of the device. Further, the fact that the SiGeC core base layer 22 contains Ge makes the bandgap $E_g$ smaller. Therefore, even if a voltage $V_{be}$ applied between the base and the emitter is lower, the collector current $I_c$ flows in a large amount such that the base current $I_b$ decreases relatively and the current gain $h_{FE}$ can increase. As a result, the typical effects of a SiGe hetero-bipolar transistor (SiGe-HBT) can be exhibited. Specifically, even if the concentration of an impurity (such as boron) is increased in the core base layer, the current gain $h_{FE}$ does not decrease that much. Thus, with the current gain $h_{FE}$ kept at a high level, the base resistance can be reduced. In the SiGeC-HBT of the present invention, however, the SiGeC core base layer 22 does not necessarily have to have a graded Ge content.

Also, since the SiGeC core base layer 22 contains carbon (C), boron diffusion in the core base layer can be controlled. Thus, the boron can be confined at a high concentration in the SiGeC core base layer 22 having a small width even after heat treatment has been carried out. In other words, as a result of the fact that the boron diffusion in the SiGeC core base layer 22 is controlled, the boron concentration in the SiGeC core base layer 22 can be kept as high as $1.4 \times 10^{19}$ atoms/cm$^3$. This effect can also be exhibited in the known SiGeC-HBT.

Figure 7A:
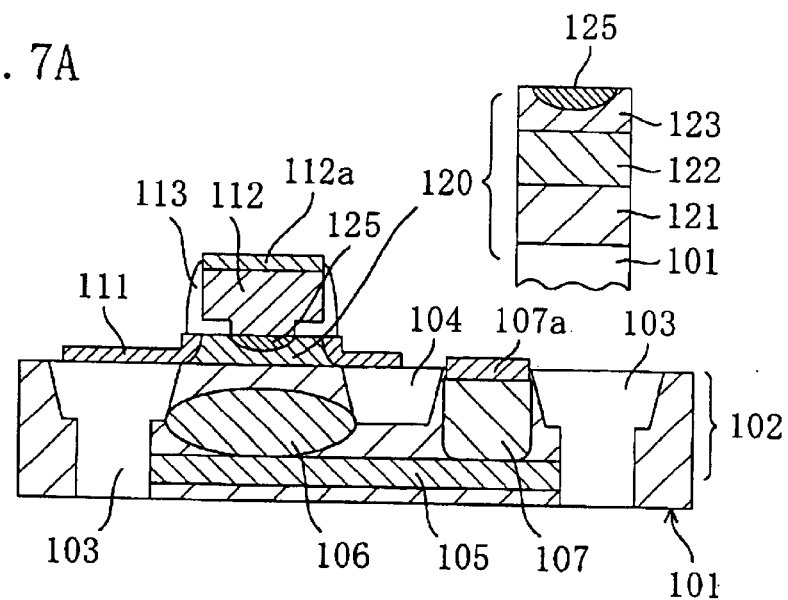
FIG. 7(a) is a cross-sectional view schematically illustrating an exemplary structure of a known SiGeC-HBT.
Figure 7B:
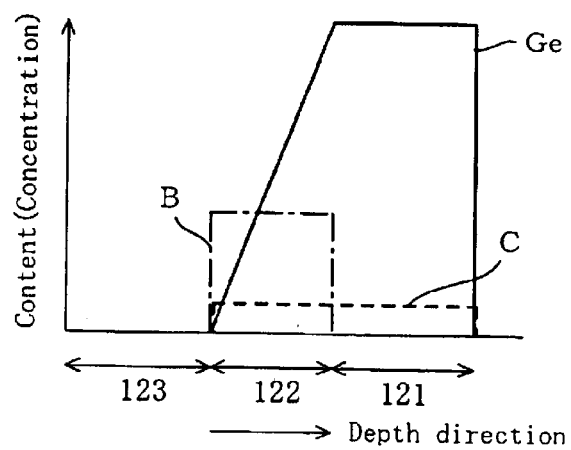
FIG. 7(b) shows profiles of Ge content, C content and impurity concentration in an emitter/base laminate portion therein.
Figure 8:
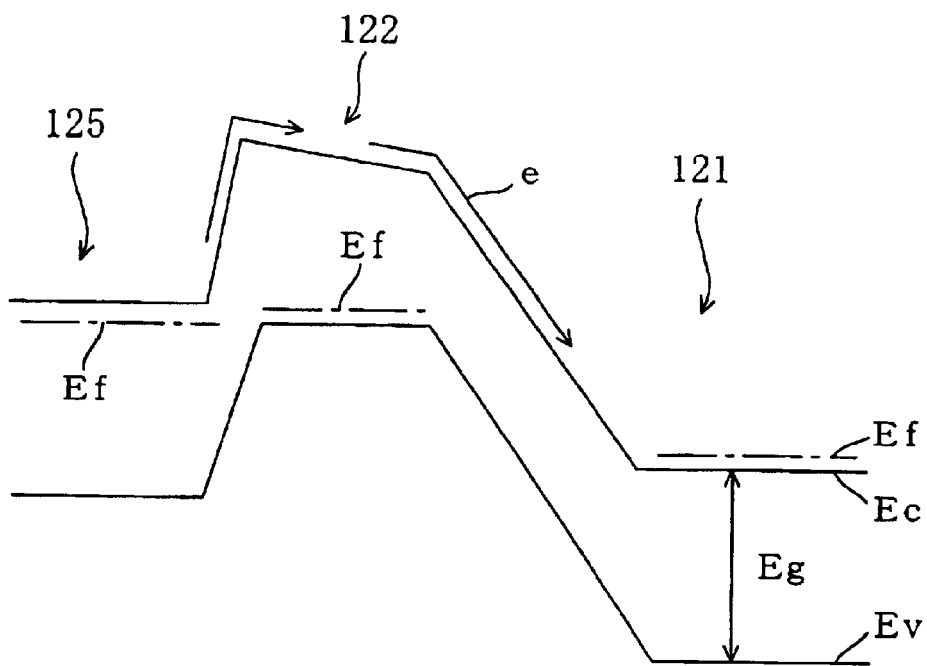
FIG. 8 is an energy band diagram showing built-in potential in a SiGeC-HBT having the structure shown in FIG. 7(b) for a longitudinal section passing through the emitter/base junction.

When a comparison is made between the impurity profiles in the emitter/base laminate portion 20 in this embodiment shown in FIG. 1(b) and the impurity profiles in known HBT shown in FIG. 7(b), the carbon content (C content) of the SiGeC core base layer 22 in this embodiment shown in FIG. 1(b) is as high as 0.8%, while the C content of the known SiGeC core base layer 122 shown in FIG. 7(b) is 0.1%. This is one of the characteristics of the SiGeC-HBT of the present invention.

Nevertheless, from experiments on samples that the present inventors made, it is evident that when the C content of a SiGeC core base layer exceeds 1.5% (0.015 proportion in the composition), the crystallinity of the SiGeC core base layer deteriorates, resulting in decrease in operating speed of the SiGeC-HBT. The C content in the SiGeC core base layer is thus preferably 1.5% or less.

FIG. 3 is a table showing the collector current $I_c$, base current $I_b$ and Early voltage $V_a$ in the sample SiGeC-HBTs. The sample A is a SiGeC-HBT in which the SiGeC spacer layer and the SiGeC core base layer have the same C content (0.5%). The sample B is a SiGeC-HBT in which the C content (0.2%) in the SiGeC spacer layer is greatly lower than the C content (0.8%) in the SiGeC core base layer. The sample C is a SiGeC-HBT in which the C content (0.2%) in the SiGeC spacer layer is a little lower than one-half of the C content (0.5%) in the SiGeC core base layer. The data shown in FIG. 3 were obtained when the shape of each element and the impurity concentrations were established in accordance with the manner described with reference to FIG. 1. The data for the collector current $I_c$ and the base current $I_b$ were obtained when a base voltage of 0.8 V was applied.

As shown in FIG. 3, when the base voltage is 0.8 V, the collector currents $I_c$ of the sample A and sample C are both in the vicinity of $2.2 \times 10^{-3}$ A and can be regarded as being substantially the same. On the other hand, the collector current $I_c$ of the sample B, which is $1.4 \times 10^{-3}$ A, is quite small. The base current $I_b$ of the sample B, in which the SiGeC core base layer has a C content of 0.8%, is about twice those of the samples A and C when the base voltage is 0.8 V. This presumably indicates that the C content in the SiGeC core base layer determines the base current $I_b$. In a comparison of the Early voltages $V_a$, the Early voltage $V_a$ is only about 22 V in the sample A in which the SiGeC spacer layer and the SiGeC core base layer have the same C content of 0.5%. On the other hand, the Early voltages $V_a$ are quite high, being 46 V and 60 V, respectively, in the samples B and C in which the C contents of the SiGeC spacer layers are lower than those of the SiGeC core base layers. The Early voltage $V_a$ normally has to be about 10 V or more. Accordingly, the data shown in FIGS. 3 and 6 indicate that the C content of the SiGeC spacer layer preferably does not exceed, or more preferably is lower than, the C content of the SiGeC core base layer.

The data further indicate that in the sample B, the current gain $h_{FE}$ is about 33, and that compared to the samples A and C, the base current $I_b$ is increased and the current gain $h_{FE}$ is lowered. This allows the breakdown voltage $BV_{CEO}$ between the emitter and the collector to be about 3.1 in the sample B, and it is evident that as compared to the samples A and C, the effect of increasing the breakdown voltage $BV_{CEO}$ between the emitter and the collector is exhibited in the sample B.

From the foregoing, given that the composition of the SiGeC core base layer is expressed by $Si_{1-x1-y1}Ge_{x1}C_{y1}$ and the composition of the SiGeC spacer layer is expressed by $Si_{1-x2-y2}Ge_{x2}C_{y2}$, it is evident that the functions and effects of the present invention can be obtained when the following conditions hold.

$0 < x1 < 1, \; 0.003 < y1 < 1$ $0 < x2 < 1, \; 0 \leq y2 \leq y1$

Furthermore, it was experimentally confirmed that variations in the base current $I_b$ can be reduced by increasing the carbon (C) content of the SiGeC core base layer from the known value (for example, 0.1 through 0.2%) to 0.3% or higher. Although the principles behind the reduction in the base-current $I_b$ variations have not been elucidated sufficiently, the reduction is an experimental fact. The present inventors' thinking concerning the principles is as follows.

Figure 4:
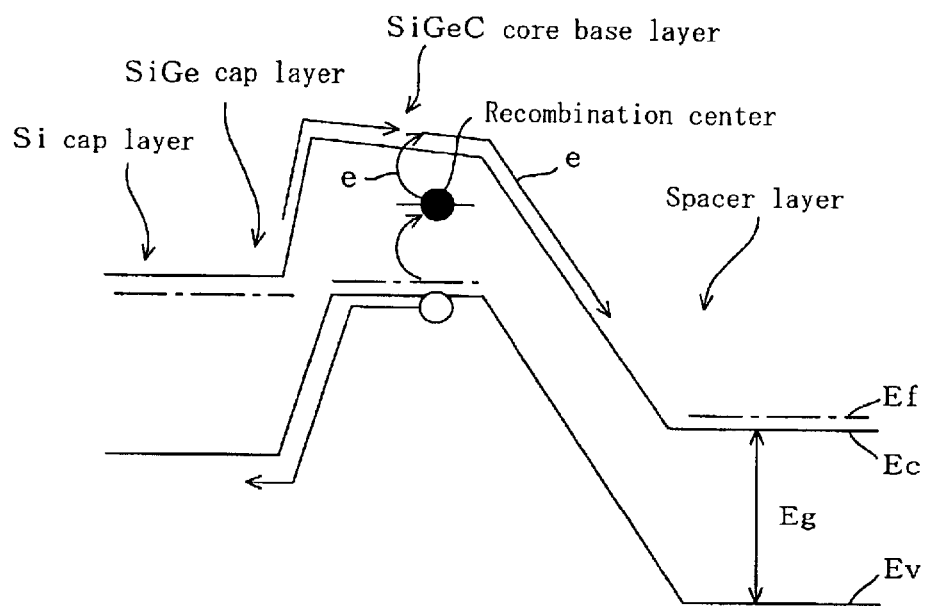
FIG. 4 is a view illustrating principles behind increased base current due to increase in C content.

FIG. 4 is a view illustrating the principles, currently regarded as being relevant by the present inventors, behind the increased base current due to the increase in the C content. In a SiGeC crystal, as carbon (C) content increases, the number of carbons located at interstitial sites increases, causing a recombination center such as shown in FIG. 4 (which is a point defect, for example, due to the carbon in this embodiment) to be created. Due to the existence of additional recombination centers in the base, there is an increased probability that electrons from the conduction band will recombine with holes from the valence band. Because this recombination occurs in a region of the base which is not depleted (i.e. "neutral"), the mechanism is known as neutral base recombination (NBR). The flow of holes into the neutral base which is required to satisfy this NBR mechanism constitutes an additional component of base current, and this phenomenon presumably occurs in the SiGeC-HBT in this embodiment. In the first place, the variations in the base current value are due to the non-uniform thickness of the native oxide film formed mainly near the interface between the Si cap layer and the polysilicon electrode (the emitter electrode) in the process step shown in FIG. 2(b) or 2(c). Apart from whether the principles shown in FIG. 4 are correct or not, from the data (facts), it can be assumed that the increase in the base current $I_b$ obtained by the increase in the C content of the SiGeC core base layer is determined by the C content and is due to the additional hole flow induced by NBR that is hardly affected by the non-uniform thickness of the native oxide film. Accordingly, the increase in the base current $I_b$ is determined by the C content in the SiGeC core base layer. When the increase in the base current $I_b$ due to the C content is larger than variation percentage in the base current $I_b$, the variations in the base current $I_b$ decrease sharply. It is evident that the higher the C content in the SiGeC core base layer, the smaller the variations in the current gain $h_{FE}$. In the case of a C content of 0.3% or higher, the variations in the current gain $h_{FE}$ decrease very notably.

Figure 5:
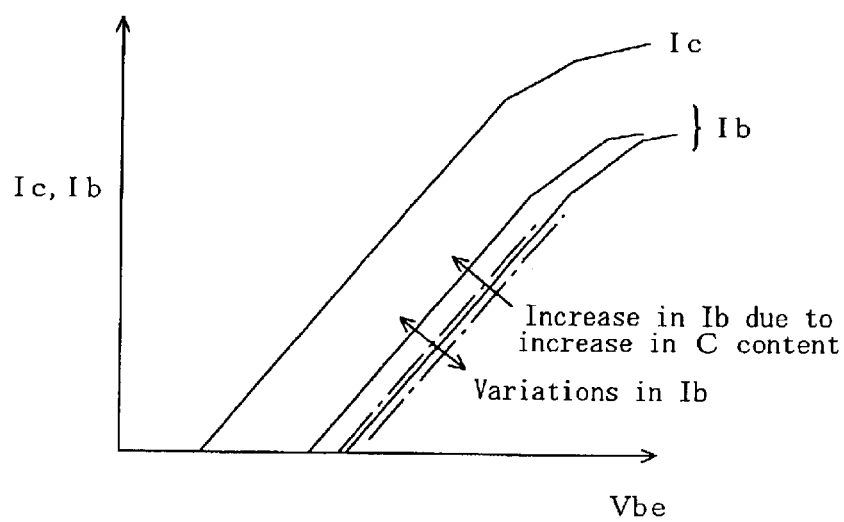
FIG. 5 is a graph showing how Gummel characteristics vary when a cap layer on an core base layer in the SiGeC-HBT is changed from being a Si cap layer to being a SiGe cap layer while C content in the SiGeC core base layer is increased.

FIG. 5 is a graph showing how Gummel characteristics vary when the cap layer on the SiGeC core base layer in the SiGeC-HBT is changed from being the Si cap layer to being a SiGe cap layer while the C content in the SiGeC core base layer is increased.

From FIG. 5, the characteristics of the base current $I_b$ and collector current $I_c$ can be understood, and the manner in which the base current value is increased due to NBR is also evident. The variations in the base current value originate in the variations in phosphorous diffusion and the hole barriers created by the native oxide film itself due to the ununiform thickness of the native oxide film formed mainly near the interface between the emitter electrode and the Si cap layer. However, as mentioned above, the increase in the base current resulting from the increase in the C content in the SiGeC core base layer is hardly affected by the non-uniform thickness of the native oxide film, leading to decrease in the variations in the entire base current. Particularly, when the amount of increase in the base current $I_b$ due to the increase in the C content is larger than the range of variations in the base current $I_b$, the variations in the base current $I_b$ decrease sharply. From this, it is evident that the higher the C content in the SiGeC core base layer, the smaller the variations in the current gain $h_{FE}$. When the standard deviation (3 sigma) in the current gain $h_{FE}$ in instances in which the C content in the SiGeC core base layer was made to be 0.2%, 0.5% and 0.8% were evaluated, they were approximately 61%, 20% and 24%, respectively. Variations in the current gain $h_{FE}$ in an HBT having the known structure, which were studied for comparison purposes, were about 60%. Considering that by increasing the C content in the SiGeC core base layer to 0.5%, the variations in the current gain $h_{FE}$ decrease sharply, it can be assumed that the effect can be obtained when the C content is 0.3% or more.

Next, preferable SiGeC spacer-layer C content for maintaining the Early voltage within proper range will be described.

Figure 6:
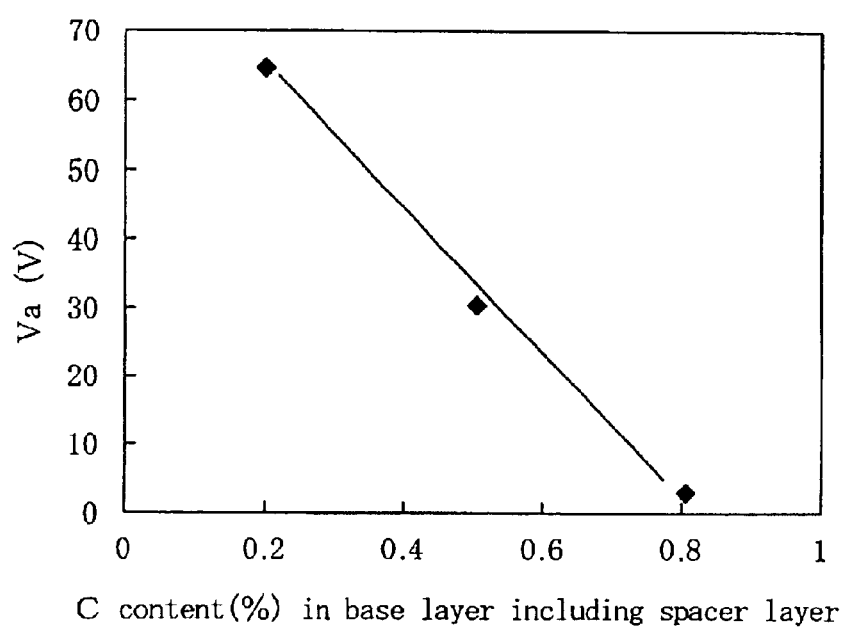
FIG. 6 is a graph showing how Early voltage varies in accordance with C content in a base layer including a spacer layer.

FIG. 6 is a graph showing how the Early voltage $V_a$ varies in accordance with the C content in the sample C that is the SiGeC-HBT with the SiGeC spacer layer and the SiGeC core base layer having the same C content. It is known that when a core base layer contains carbon (C) in large quantity, the Early voltage $V_a$ normally decreases as the C content increases. This is presumably because when the base layer contains a large quantity of carbon (C), the carbon forms a recombination center in a depletion layer at the collector/base junction (the CB junction), resulting in increase in recombination current.

In terms of the characteristics, it is desirable that the Early voltage $V_a$ be high. In the SiGeC-HBT in this embodiment, the C content in the SiGeC spacer layer 21 is lower than that in the SiGeC core base layer 22; as a result of this, decrease in the Early voltage $V_a$ can be prevented while the essential effect of reducing variations in the current gain $h_{FE}$ is maintained.

Particularly, as shown in FIG. 6, to make the Early voltage $V_a$ 10 V or more, it is preferable that the C content in the SiGeC spacer layer be 0.7% or less.

What is claimed is:

1. A semiconductor device comprising:
    a Si layer functioning as a collector layer and a semiconductor layer formed over the Si layer and functioning as an emitter layer and as a base layer,
    wherein the semiconductor layer includes:
    an core base layer whose composition is expressed by $Si_{1-x_1-y_1}Ge_{x_1}C_{y_1}$ (wherein $0<x_1<1$, $0.003 \leq y_1<1$), and
    a spacer layer which is formed under and in contact with the core base layer and whose composition is expressed by $Si_{1-x_2-y_2}Ge_{x_2}C_{y_2}$ (wherein $0<x_2<1$, $0 \leq y_2 < y_1$).

2. The device of claim 1, wherein the C proportion $y_1$ in the core base layer composition is 0.003 or more to 0.015 or less.

3. The device of claim 1 further comprises an emitter electrode formed over the semiconductor layer and made of polysilicon.

4. The device of claim 3, wherein:
    the semiconductor layer further includes a Si cap layer, and
    the emitter layer is formed in the Si cap layer.

5. The device of claim 1, wherein the C proportion $y_2$ in the spacer layer composition is 0.007 or less.

6. A semiconductor device comprising:
    a collector layer, a semiconductor layer formed over the collector layer and an emitter layer formed over the semiconductor layer,
    wherein the semiconductor layer includes:
    a core base layer whose composition is expressed by $Si_{1-x_1-y_1}Ge_{x_1}C_{y_1}$ (wherein $0<x_1<1$, $0<y_1<1$), and
    a spacer layer which is formed under and in contact with the core base layer and whose composition is expressed by $Si_{1-x_2-y_2}Ge_{x_2}C_{y_2}$ (wherein $0<x_2<1$, $0 \leq y_2 < y_1$).

7. The device of claim 6, further comprising a recombination center between the collector layer and the core base layer.

8. The device of claim 6, wherein a top surface of the semiconductor layer is a diffusion layer.

9. The device of claim 8, wherein the top surface of the semiconductor layer is in contact with the core base layer.

10. The device of claim 6, wherein $y_1$ of the carbon composition of the core base layer is 0.003 or more and 0.015 or less.

11. The device of claim 6, wherein $y_1$ of the carbon composition of the spacer layer is 0.007 or less.

12. The device of claim 6, wherein the collector layer is formed in a substrate.

* * * * *